United States Patent
Lee

(10) Patent No.: US 7,551,055 B2
(45) Date of Patent: Jun. 23, 2009

(54) RESISTOR HAVING UNIFORM RESISTANCE AND SEMICONDUCTOR DEVICE USING THE SAME

(75) Inventor: Chang-hoon Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 548 days.

(21) Appl. No.: 11/312,982

(22) Filed: Dec. 20, 2005

(65) Prior Publication Data

US 2006/0164202 A1 Jul. 27, 2006

(30) Foreign Application Priority Data

Jan. 22, 2005 (KR) .................... 10-2005-0006101

(51) Int. Cl.
*H01C 10/16* (2006.01)
(52) U.S. Cl. .................... 338/48; 338/7; 338/9
(58) Field of Classification Search ............... 338/48
See application file for complete search history.

(56) References Cited

U.S. PATENT DOCUMENTS

| 5,187,559 | A | | 2/1993 | Isobe et al. ................. 257/538 |
| 5,489,547 | A | * | 2/1996 | Erdeljac et al. ............. 438/238 |
| 6,097,276 | A | * | 8/2000 | Van Den Broek et al. ....... 338/9 |
| 6,960,979 | B2 | * | 11/2005 | Banerjee ....................... 338/7 |

FOREIGN PATENT DOCUMENTS

| JP | 60-154551 | 8/1985 |
| JP | 63-273347 | 11/1988 |
| JP | 03-166757 | 7/1991 |
| KR | 10-0194596 B1 | 2/1999 |

OTHER PUBLICATIONS

Notice to Submit Response and English-language translation issued Aug. 30, 2006 in counterpart Korean application No. 10-2005-0006101.

* cited by examiner

*Primary Examiner*—Elvin G Enad
*Assistant Examiner*—Joselito Baisa
(74) *Attorney, Agent, or Firm*—Mills & Onello, LLP

(57) ABSTRACT

A resistor having a uniform resistance, in which a serial resistance of resistors with different resistance temperature coefficients is not influenced by change in temperature, and a semiconductor device using the same includes: a first resistor having a first width and a first length and having a negative resistance temperature coefficient; and a second resistor serially connected to the first resistor, the second resistor having a positive resistance temperature coefficient, wherein the second resistor has a second width and a second length of different dimensions to satisfy a following Equation $x = -(Tp \times Rp)/Ta \times Ra$, where Tp and Ta are the respective resistance temperature coefficients of the first and the second resistors, and Rp and Ra are the respective sheet resistances of the first and the second resistors.

9 Claims, 2 Drawing Sheets

# RESISTOR HAVING UNIFORM RESISTANCE AND SEMICONDUCTOR DEVICE USING THE SAME

CROSS-REFERENCE TO RELATED PATENT APPLICATION

This application claims the benefit of Korean Patent Application No. 10-2005-0006101, filed on Jan. 22, 2005, in the Korean Intellectual Property Office, the disclosure of which is incorporated herein in its entirety by reference.

BACKGROUND OF THE INVENTION

1. Field of the Invention

The present invention relates to a semiconductor device, and more specifically, to a resistor having a serially uniform resistance and a semiconductor device using the same.

2. Description of the Related Art

When current flows through an integrated circuit (IC), heat is generated that changes the operating temperature of the IC. The temperature of an IC can also vary in response to the temperature of the external environment of the IC. A temperature change in an IC can destabilize the inherent characteristics of an element. As IC elements become smaller due to ever increasing integration of semiconductor devices, inherent operating characteristics of the element are more susceptible to change.

One of the important changes that can occur in the inherent operating characteristics of an element is a change in the resistance of an element that can be caused by a temperature change. To form a resistor, which is a passive element, polysilicon and impurity regions are formed by injecting impurities into single crystal silicon.

U.S. Pat. No. 5,187,559 provides an example of a polycrystalline silicon based resistor formed as an IC element. Table 1 is an example of the resistance temperature coefficient of such a resistor that represents the change of the resistance according to the temperature of the polysilicon and the impurity region, and the resulting sheet resistance Rs (25° C.) at an operating temperature of 25° C.

TABLE 1

| Resistor Type | Resistance Temperature Coefficient | Rs(25° C.) |
| --- | --- | --- |
| Polysilicon | −0.0352% | 590 Ω/square |
| Impurity Region | +0.1014% | 155 Ω/square |

The resistance temperature coefficient is the rate of the resistance change in response to temperature, based on the resistance at 25° C. The sheet resistance Rs (25° C.) is the resistance of a sheet-type resistor with its width equal to its length at an operating temperature of 25° C. A sheet having a length equal to its width is referred to as a square, or unit area. If a polysilicon region and an impurity region each have 1 square, this means that each sheet of polysilicon region and impurity region has a length equal to its width.

Referring to FIG. 1, polysilicon has a property such that its resistance decreases when its temperature rises, and the impurity region has a property such that its resistance increases when its temperature rises. That is, the polysilicon has a negative resistance temperature coefficient, whereas the impurity region has a positive resistance temperature coefficient. It is generally assumed that the operating temperature of an IC ranges between −45° C. and 125° C. when testing for a change in its resistance. When operating with a plurality of resistors in combination, it is difficult to maintain a uniform resistance because the resistance temperature coefficient of each resistor is different. Especially, if resistors with different resistance temperature coefficients are arranged in series, it is difficult to maintain uniform resistance throughout the series.

In order to maintain uniform resistance, a separate temperature compensation circuit can be used to adjust for the change in the resistance, which increases the number of manufacturing processes and increases overall cost. Therefore, resistors that can have different resistance temperature coefficients, but which will carry a uniform overall resistance, despite fluctuations in temperature, are needed.

SUMMARY OF THE INVENTION

The present invention provides a resistor having a uniform resistance, in which a combined resistance of serial resistors with different resistance temperature coefficients is not influenced by change in temperature.

The present invention also provides a semiconductor device using a resistor having a uniform resistance, in which a combined resistance of serial resistors with different resistance temperature coefficients is not influenced by change in temperature.

In one aspect, the present invention is directed to a resistor having uniform resistance, including: a first resistor having a first width and a first length and having a negative resistance temperature coefficient; and a second resistor serially connected to the first resistor, the second resistor having a positive resistance temperature coefficient, wherein the second resistor has a second width and a second length of different dimensions to satisfy a following Equation $$x = -(Tp \times Rp)/Ta \times Ra,$$

where Tp and Ta are the respective resistance temperature coefficients of the first and the second resistors, and Rp and Ra are the respective sheet resistances of the first and the second resistors.

In one embodiment, the first width and the first length are of equal dimensions.

In another embodiment, the second length is 1.2 to 1.5 times the dimension of the second width.

In another embodiment, the first resistor comprises a polysilicon structure formed on a semiconductor substrate.

In another embodiment, the second resistor comprises an impurity region formed inside a semiconductor substrate.

In another embodiment, a first area of the first resistor comprising the first width multiplied by the first length and a second area of the second resistor comprising the second width multiplied by the second length are selected such that the resistor including the first resistor and the second resistor connected in series has a resistance ratio, that is the change in resistance with respect to change in operating temperature, that is substantially zero over a range of operating temperatures.

In another aspect, the present invention is directed to a semiconductor device including a resistor of a uniform resistance, comprising: a first resistor formed on a semiconductor substrate, the first resistor having a first width equal in dimension to a first length and having a negative resistance temperature coefficient; a second resistor formed in the semiconductor substrate, separated from the first resistor by a predetermined distance and serially connected to the first resistor, the second resistor having a positive resistance temperature coefficient and having a second width and a second length of different dimensions to satisfy a following Equation $$x=-(Tp \times Rp)/Ta \times Ra$$

where Tp and Ta are the respective resistance temperature coefficients of the first and the second resistors, and Rp and Ra are the respective sheet resistances of the first and the second resistors; and a metal wiring layer serially connecting one end of the first resistor to one end of the second resistor.

In one embodiment, the first width and the first length are of equal imensions.

In another embodiment, the second length are 1.2 to 1.5 times the dimension of the second width.

In another embodiment, the first resistor comprises a polysilicon structure in the form of a pad and is formed on a semiconductor substrate.

In another embodiment, the second resistor comprises an impurity region formed inside the semiconductor substrate.

In another embodiment, the first resistor comprises be polysilicon and the second resistor comprises an impurity region, and the value of x is approximately 1.32.

In another aspect, the present invention is directed to a resistor having a uniform resistance, comprising: a first resistor having a first width and a first length and having a negative resistance temperature coefficient; and a second resistor having a second width and a second length serially connected to the first resistor, the second resistor having a positive resistance temperature coefficient, wherein a first area of the first resistor comprising the first width multiplied by the first length and a second area of the second resistor comprising the second width multiplied by the second length are selected such that the resistor including the first resistor and the second resistor connected in series has a resistance ratio, that is the change in resistance with respect to change in operating temperature, that is substantially over a range of operating temperatures.

In one embodiment, the first width and the first length are of equal dimensions.

In another embodiment, the second length is 1.2 to 1.5 times the dimension of the second width.

In another embodiment, the first resistor comprises a polysilicon structure formed on a semiconductor substrate.

In another embodiment, the second resistor comprises an impurity region formed inside a semiconductor substrate.

In another embodiment, the first and second areas of the first and second resistors are selected to satisfy a following Equation $$x=-(Tp \times Rp)/Ta \times Ra,$$

where Tp and Ta are respective resistance temperature coefficients of the first and the second resistors, and Rp and Ra are respective sheet resistances of the first and the second resistors.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete.

In a resistor of the present invention, the resistance R(T) is a function of temperature (T) as defined in Equation 1 below, $$R(T)=Rs(1.0+TCR \times \Delta T), \Delta T=T-25°\text{ C}. \quad \text{(Equation 1)}$$

wherein the temperature coefficient of resistor (TCR) is the resistance temperature coefficient that demonstrates a change in resistance according to a change in temperature, and Rs is the sheet resistance of a sheet-type resistor having a width equal to its length at 25° C. The resistances of the first and the second resistors can be derived at −45° C., 25° C., and 125° C. using Equation 1 above. Also, the resistance change ratio ΔR can be derived for the change of resistance from −45° C. to 125° C. using Equation 2 below.

$$\Delta R = \text{change of resistance/change of temperature} \quad \text{(Equation 2)}$$
$$= [R(125°\text{ C}.) - R(-45°\text{ C}.)]/170$$

A system and method for providing a uniform resistance change ratio ΔR will now be described.

The first resistor (for example, formed of polysilicon) having a negative resistance temperature coefficient has a resistance temperature coefficient Tp and a sheet resistance Rp, and the second resistor (for example, formed of an impurity region) having a positive resistance temperature coefficient has a resistance temperature coefficient Ta and a sheet resistance Ra. Using Equations 1 and 2, the changes in the resistances ΔRp and ΔRa according to changes in temperature are obtained as $$\Delta Rp = [Rp(125°\text{ C}.) - R(-45°\text{ C}.)]/170$$
$$= [Rp(1.0 + Tp \times (125-25)) - Rp(1.0 + Tp(-45-25))]/170$$
$$= Tp \times Rp$$
$$\Delta Ra = Ta \times Ra.$$

On the one hand, if a uniform resistance is to be derived from the temperatures of the first and the second resistors that are serially connected, then ΔRp+ΔRa=0. Here, x is the ratio of the size of 1 square of the second resistor to 1 square of the first resistor. Furthermore, in order to maintain a uniform resistance (that is influenced by temperature), x is used to obtain appropriate values for W2 and L2 of the second resistor. The parameter x is defined by Equation 3 below.

$$x=-\Delta Rp/\Delta Ra=-(Tp \times Rp)/(Ta \times Ra) \quad \text{(Equation 3)}$$

Figure 1A:
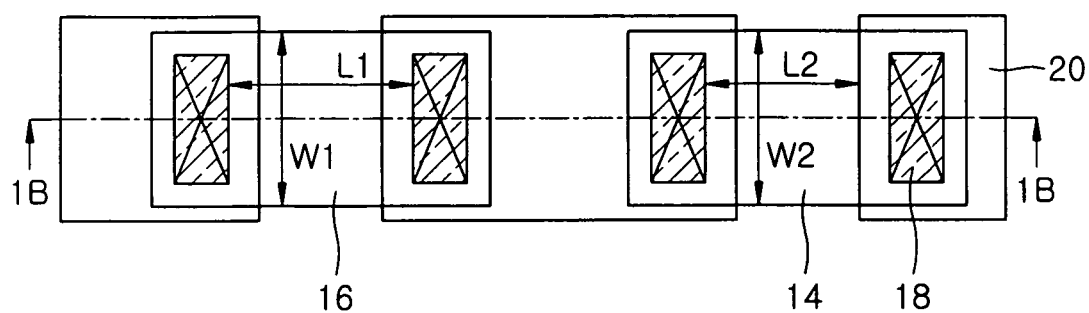
FIG. 1A is a plan view of a first embodiment of the present invention showing the layout of a first resistor, having a width (W1) equal to its length (L1), and a second resistor, having a width (W2) equal to its length (L2)
Figure 1B:
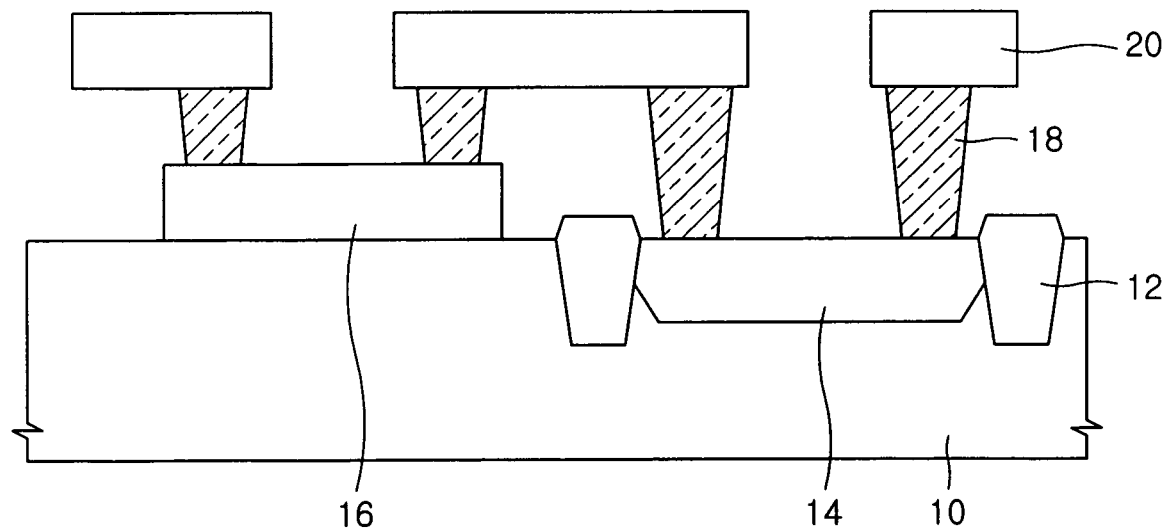
FIG. 1B is a sectional view taken along line 1B-1B of FIG. 1A.

FIG. 1A is a plan view of a first embodiment of the present invention showing the layout of a first resistor 16, having a width W1 equal to its length L1, and the second resistor, having a width W2 equal to its length L2 and FIG. 1B is a cross-sectional view taken along line 1B-1B of FIG. 1A.

Referring to FIGS. 1A and 1B, the first resistor 16, having a width W1 equal to its length L1, is formed on a semiconductor substrate 10. L1 refers to the minimum distance between contacts 18 formed inside the first resistor 16, and W1 refers to the width of the first resistor 16 in a direction that is perpendicular to L1. The first resistor 16 has a negative resistance temperature coefficient, whereby the resistance decreases as temperature increases. The first resistor 16 comprises, example a material such as polysilicon, and can be formed on the semiconductor substrate 10 in the form of a pad.

The second resistor 14, having a width W2 and a length L2 that are equal, is separated from the first resistor 16 by a predetermined distance, and is formed in the semiconductor substrate 10. L2 and W2 are defined in the same way as their counterparts of the first resistor 16. The second resistor 14 is bounded by an insulating film 12. The second resistor 14 has a positive resistance temperature coefficient, whereby the resistance increases as temperature increases. The second resistor 14 comprises, for example, an impurity region that is formed by injecting impurities into a single crystal silicon substrate. One end of the first resistor 16 is serially connected to one end of the second resistor 14 via contacts 18 and a metal wiring layer 20 as shown in FIG. 1B.

Table 2 illustrates the resistance at −45° C., 25° C., and 125° C. and the resistance ratio (ΔR) given by Equation 2 in the case where the respective resistors are serially connected according the first embodiment of the present invention shown in FIGS. 1A and 1B.

TABLE 2

| Resistor Type | Square | −45° C. | 25° C. | 125° C. | ΔR |
| --- | --- | --- | --- | --- | --- |
| Polysilicon | 1.00 | 604.5 | 590.0 | 569.2 | −20.77% |
| Impurity Region | 1.00 | 144.0 | 155.0 | 170.0 | 15.72% |
| Serial Resistor | 2.00 | 748.5 | 745.0 | 739.9 | −5.37% |

When the resistors are serially connected, because resistance change in the first resistor 16 (having a positive resistance temperature coefficient) and the resistance change in the second resistor 14 (having a negative resistance temperature coefficient) substantially cancel each other out, the resistance ratio ΔR of the combined serial resistor derived from Equation 2 at temperatures of −45° C. to 125° C. is reduced to −5.37%, which is much less than the resistance ratios ΔR of the individual serial first and second resistors.

Figure 2A:
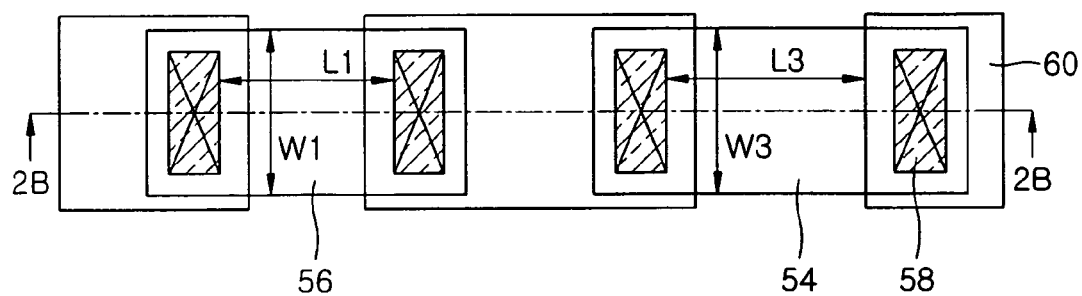
FIG. 2A is a plan view a second embodiment of the present invention showing the layout of the first resistor, having a width (W1) equal to its length (L1), and having a second resistor, having a width (W3) that is different in size than its length (L3)
Figure 2B:
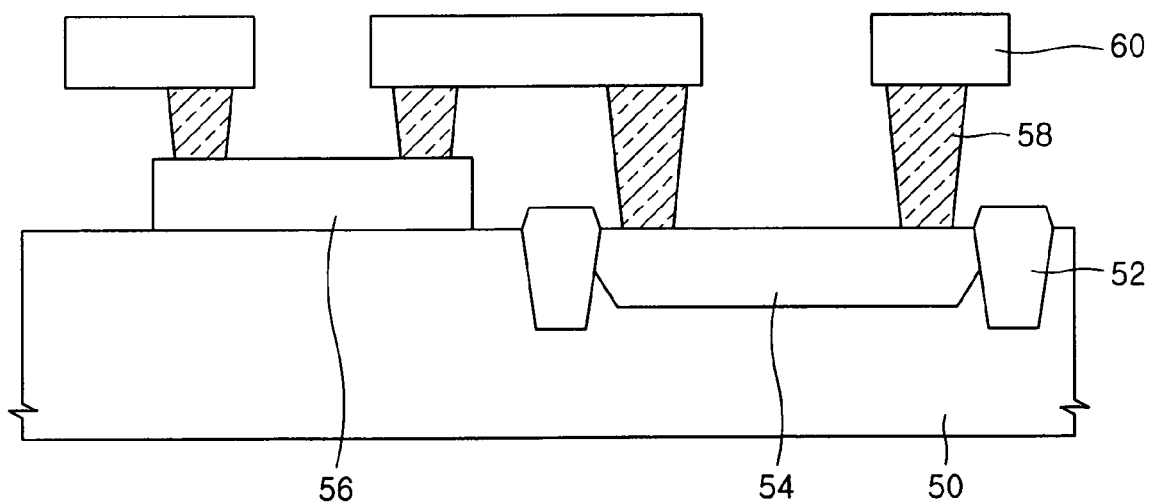
FIG. 2B is a sectional view taken along line 2B-2B of FIG. 2A.

FIG. 2A is a plan view of a second embodiment of the present invention showing the layout of a first resistor 56, having a width W1 equal to its length L1, and a second resistor 54, having a width W3 and a length L3 that are different, and FIG. 2B is a cross-sectional view taken along line 2B-2B of FIG. 2A.

Referring to FIGS. 2A and 2B, the first resistor 56, having a width W1 equal to its length L1, is formed on a semiconductor substrate 50. L1 refers to the minimum distance between contacts 58 that contact the first resistor 56, and W1 refers to the width of the first resistor 56 in a direction that is perpendicular to L1. The first resistor 56 has a negative resistance temperature coefficient, whereby the resistance decreases as temperature increases. The first resistor 56 comprises, for example, a material such as polysilicon, and can be formed on the semiconductor substrate 50 in the form of a pad.

The second resistor 54, having a width W3 and a length L3 that satisfy Equation 3, is separated from the first resistor 56 by a predetermined distance, and is formed in the semiconductor substrate 50. The second resistor 54 is bounded by an insulating film 52. L3 and W3 are defined in the same way as their counterparts of the first resistor 56. The second resistor 54 has a positive resistance temperature coefficient, whereby the resistance increases as temperature increases. The second resistor 54 can take the form of an impurity region formed with impurities that are injected in a single crystal silicon substrate. One end of the first resistor 56 is serially connected to one end of the second resistor 54 via contacts 58 and a metal wiring layer 60 as shown in FIG. 2B.

W3 and L3 can be derived with data from Table 1 using Equation 3. Here, a resistance temperature coefficient Tp for the polysilicon that is the first resistor 56 is −0.0352, and its sheet resistance Rs is 590; and a resistance temperature coefficient Ta for the impurity region that is the second resistor 54 is 0.1014, and its sheet resistance Rs is 155. Accordingly, when x=−[(−0.0352)×(590)]/0.1014×155, x is approximately 1.3214. Moreover, if the second resistor 54 is increased by approximately 1.3214 squares, or area units, more than the first resistor, the combined serial resistance of serial combination of the first resistor 56 and the second resistor 54 is nearly 0.

The 1.3214 squares can be obtained by maintaining W3 of the second resistor 54 to be the same as W2 of the comparison case, and making L3 1.3214 times larger than L2. Thus, L3 is approximately 1.3214 times the length of L2. Other length and width parameters of the first and second resistors, or areas or square units thereof, can alternatively be modified to accomplish the same result, namely a combined serial resistance that is substantially zero.

Table 3 illustrates the resistance at −45° C., 25° C., and 125° C. and the resistance ratio (ΔR) given by Equation 2 in the case where the respective resistors are serially connected according to the second embodiment of the present invention shown in FIGS. 2A and 2B.

TABLE 3

| Resistance Type | Square | −45° C. | 25° C. | 125° C. | ΔR |
| --- | --- | --- | --- | --- | --- |
| Polysilicon | 1.00 | 604.5 | 590.0 | 569.2 | −20.77% |
| Impurity Region | 1.3214 | 190.0 | 204.0 | 225.3 | −20.75% |
| Serial Resistor | 2.3214 | 794.6 | 794.6 | 794.6 | −0.02% |

When the resistors are serially connected, because the resistance change of the first resistor 56 (having a positive resistance temperature coefficient) and the resistance change of the second resistor 44 (having a negative resistance temperature coefficient) substantially cancel each other out, the resistance ratio ΔR derived from Equation 2 at temperatures of −45° C. to 125° C. is reduced to −0.02%. In the combined serial resistor including the first and second resistors connected in series, there is virtually no change in resistance as a result of change in operating temperature.

The resistors and the semiconductor device using the same according to the present invention can, by controlling the square ratio of the first resistor to the second resistor, maintain a uniform resistance through the serially connected first and second resistors, despite changes in temperature.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A resistor having a uniform resistance, comprising:
   a first resistor having a first width and a first length and having a negative resistance temperature coefficient; and
   a second resistor serially connected to the first resistor in the lengthwise direction, the second resistor having a second width and a second length, and having a positive resistance temperature coefficient,
   wherein a second ratio of the second length to the second width is obtained using Tp, Rp, Ta, Ra and a first ratio of the first length to the first width, where Tp and Ta are respective resistance temperature coefficients of the first and the second resistors, and Rp and Ra are respective sheet resistances of the first and the second resistors, and
   wherein the second ratio is equal to $-(Tp \times Rp)/(Ta \times Ra)$ multiplied by the first ratio so that the resistor formed by the first resistor and the second resistor has a uniform resistance, such that, the sum of resistances of the first and second resistors is substantially independent of changes in temperature.

2. The resistor of claim 1, wherein the first width and the first length are of equal dimensions.

3. The resistor of claim 1, wherein the first resistor comprises a polysilicon structure formed on a semiconductor substrate.

4. The resistor of claim 1, wherein the second resistor comprises an impurity region formed in a semiconductor substrate.

5. A semiconductor device including a resistor of a uniform resistance, comprising:
   a first resistor formed on a semiconductor substrate, the first resistor having a first length and a first width equal in dimension to the first length and having a negative resistance temperature coefficient;
   a second resistor formed in the semiconductor substrate, separated from the first resistor by a predetermined distance and serially connected to the first resistor, the second resistor having a positive resistance temperature coefficient and having a second width and a second length, wherein a second ratio of the second length to the second width is obtained using Tp, Rp, Ta, Ra and a first ratio of the first length to the first width, where Tp and Ta are respective resistance temperature coefficients of the first and the second resistors, and Rp and Ra are respective sheet resistances of the first and the second resistors; and
   a metal wiring layer serially connecting one end of the first resistor to one end of the second resistor via bridged contacts,
   wherein the second ratio is equal to $-(Tp \times Rp)/(Ta \times Ra)$ so that the resistor formed by the first resistor and the second resistor has a uniform resistance, such that, the sum of the resistances of the first and second resistors is substantially independent of changes in temperature.

6. The semiconductor device of claim 5, wherein the first width and the second width are of equal dimensions.

7. The semiconductor device of claim 5, wherein the first resistor comprises a polysilicon structure formed on a semiconductor substrate.

8. The semiconductor device of claim 5, wherein the second resistor comprises an impurity region formed in the semiconductor substrate.

9. The semiconductor device of claim 5, wherein the first resistor comprises polysilicon and the second resistor comprises an impurity region, and the second ratio is from about 1.2 to about 1.5.

* * * * *